US010931296B2

(12) United States Patent
Boemler

(10) Patent No.: US 10,931,296 B2
(45) Date of Patent: Feb. 23, 2021

(54) SELF-CORRECTING ANALOG COUNTER READOUT FOR DIGITAL PIXELS

(71) Applicant: Raytheon Company, Waltham, MA (US)

(72) Inventor: Christian M. Boemler, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/593,521

(22) Filed: Oct. 4, 2019

(65) Prior Publication Data
US 2020/0112319 A1 Apr. 9, 2020

Related U.S. Application Data

(60) Provisional application No. 62/741,077, filed on Oct. 4, 2018.

(51) Int. Cl.
*H03M 1/44* (2006.01)
*H04N 5/378* (2011.01)

(52) U.S. Cl.
CPC ........... *H03M 1/442* (2013.01); *H04N 5/378* (2013.01)

(58) Field of Classification Search
CPC .............................. H03M 1/442; H04N 5/378
USPC ............................... 341/130–155; 250/214 R
See application file for complete search history.

(56) References Cited

U.S. PATENT DOCUMENTS

| 4,017,856 | A | * | 4/1977 | Wiegand | G01S 7/38 |
| | | | | | 342/15 |
| 6,525,304 | B1 | * | 2/2003 | Merrill | H04N 3/155 |
| | | | | | 250/208.1 |
| 7,202,463 | B1 | | 4/2007 | Cox | |
| 8,314,783 | B2 | * | 11/2012 | Sambandan | G09G 3/3233 |
| | | | | | 345/204 |
| 2017/0295333 | A1 | * | 10/2017 | Boemler | H04N 5/378 |

OTHER PUBLICATIONS

International Search Report in PCT/US2019/053773 dated Dec. 2, 2019, pp. 1-5.
Written Opinion of the International Searching Authority in PCT/US2019/053773 dated Dec. 2, 2019, pp. 1-7.

* cited by examiner

*Primary Examiner* — Lam T Mai
(74) *Attorney, Agent, or Firm* — Cantor Colburn LLP

(57) ABSTRACT

A digital unit cell, readout circuit for a digital unit cell and a method of operating an analog counter of a digital unit cell is disclosed. The readout circuit includes storage capacitor for storing a voltage remaining at an analog counter at the end of an integration period, and a comparator circuit. The comparator circuit compares a dummy voltage provided from the analog counter during a readout period to the voltage at the storage capacitor, and determines the voltage at the storage capacitor when the dummy voltage falls below the voltage at the storage capacitor.

20 Claims, 4 Drawing Sheets

US 10,931,296 B2

SELF-CORRECTING ANALOG COUNTER READOUT FOR DIGITAL PIXELS

RELATED CASES

The present invention claims priority to U.S. Provisional Application Ser. No. 62/741,077 filed Oct. 4, 2018, the contents of which are incorporated herein by reference in their entirety.

BACKGROUND

The present disclosure relates to analog counter circuits and methods of operating an analog counter circuit and, in particular, a method and apparatus for determining a voltage level output from the analog count circuit.

Digital pixel include circuitry that outputs a digital level in response to a light impinging at a photodetector or other analog sensor. The digital pixel generally includes various circuitry for converting light intensity to a digital level. An analog counter circuit of the digital pixel is used to obtain a voltage representative of the light production. A readout circuit can then be used to read the voltage for input to an image processing circuit. However, the proximity of digital pixels to each other can produce noise that affects the voltage readout, whereas adjacent pixels can produce different voltages for a same count value. Calibration can be performed off-chip but requires large amount of processing and power requirements.

SUMMARY

According to one embodiment of the present disclosure, a method of operating an analog counter of a digital unit cell is disclosed, the method including: storing a voltage from the analog counter to a storage capacitor of a read out circuit at an end of an integration period; generating a dummy voltage at the analog counter; comparing the voltage at the storage capacitor to the dummy voltage level to read out the voltage stored at the readout circuit; and determining the voltage at the storage capacitor when the dummy voltage falls below the voltage at the storage capacitor.

According to another embodiment of the present disclosure, a readout circuit for digital unit cell is disclosed, the readout circuit including: a storage capacitor for storing a voltage remaining at an analog counter at the end of an integration period; and a comparator circuit configured to: compare a dummy voltage provided from the analog counter during a readout period to the voltage at the storage capacitor, and determine the voltage at the storage capacitor when the dummy voltage falls below the voltage at the storage capacitor.

According to yet another embodiment of the present disclosure, a digital unit cell is disclosed, the digital unit cell including: an analog counter that outputs a voltage level at an end of an integration period and generates a dummy voltage during a readout period; and a readout circuit configured to: store the voltage level obtained at the analog counter at the end of the integration period, compare the voltage at the storage capacitor to the dummy voltage during the readout period, and determine the voltage at the storage capacitor when the dummy voltage falls below the voltage at the storage capacitor.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The forgoing and other features, and advantages of the disclosure are apparent from the following detailed description taken in conjunction with the accompanying drawings in which:

DETAILED DESCRIPTION

Figure 1:
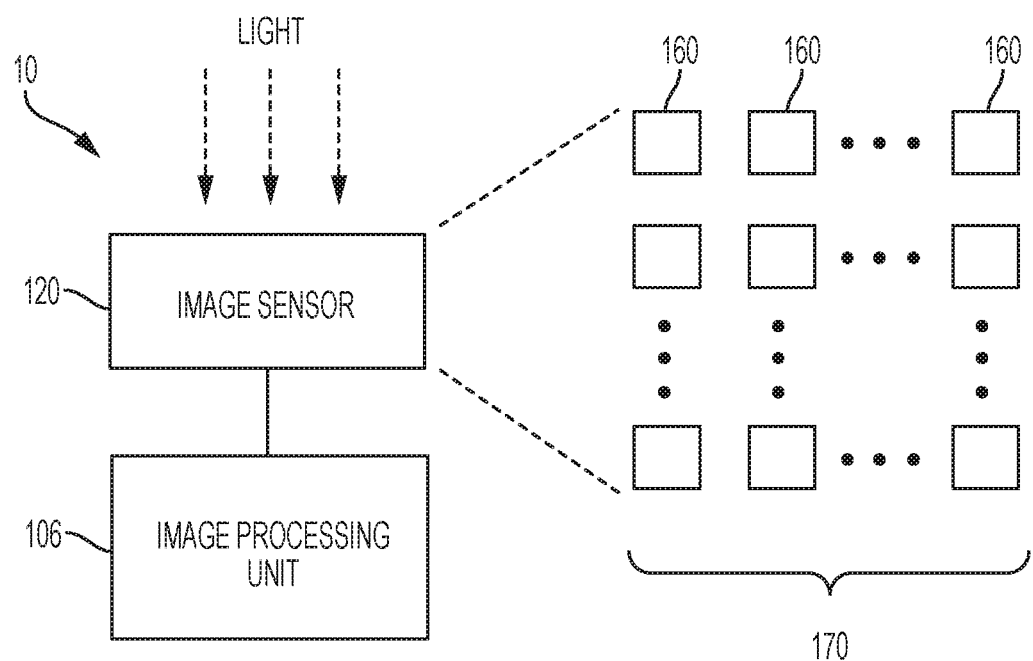
FIG. 1 is a block diagram illustrating an image capture device that may be used to capture images according to aspects described herein.

FIG. 1 is a block diagram illustrating an image capture device 10 that may be used to capture images according to aspects described herein. For example device 10 may be a digital camera, video camera, or other photographic and/or image capturing equipment. Image capture device 10 comprises image sensor 120 and image processing unit 106. Image sensor 120 may be an Active Pixel Sensor (APS) or other suitable light sensing device that can capture images Image processing unit 106 may be a combination of hardware, software, and/or firmware that is operable to receive signal information from image sensor 120 and convert the signal information into a digital image.

Image sensor 120 includes an array 170 of unit cells 160. Each unit cell 160 accumulates charge proportional to the light intensity at that location in the field of view and provides an indication of the intensity of light at that location to the image processing unit 106. Each unit cell 160 may correspond to a pixel in the captured electronic image.

A particular method for image capture using image capture device 10 may be ripple capture. Ripple capture is a method that captures each row of unit cells from image sensor 120 in order. For example, ripple capture may expose the top row of unit cells of image sensor 120 to light, followed by the second row, followed by the third row, and so forth until the last row of unit cells of image sensor 120 is exposed to light. Another particular method for image processing unit 106 to receive pixel information captured by image sensor 120 may be ripple read. Ripple read is a method that processes each row of unit cells from image sensor 120 in order. Similar to ripple capture, ripple read may process the top row of unit cells of image sensor 120, followed by the second row, followed by the third row, and so forth until the last row of unit cells of image sensor 120 is processed. A ripple reset operation to reset the rows of unit cells of image sensor 120 may be performed similarly.

These methods may be performed on consecutive rows. For example, a ripple capture operation may begin with the first row of image sensor 120. As the ripple capture operation moves to the second row, a ripple read operation may begin on the first row of image sensor 120. After the ripple capture operation moves to the third row, the ripple read operation may begin on the second row and a ripple reset operation may begin on the first row. This may continue until the last row is processed. Once the last row is processed, the image may be processed, stored, and/or transmitted by the image processing unit 106.

Figure 2:
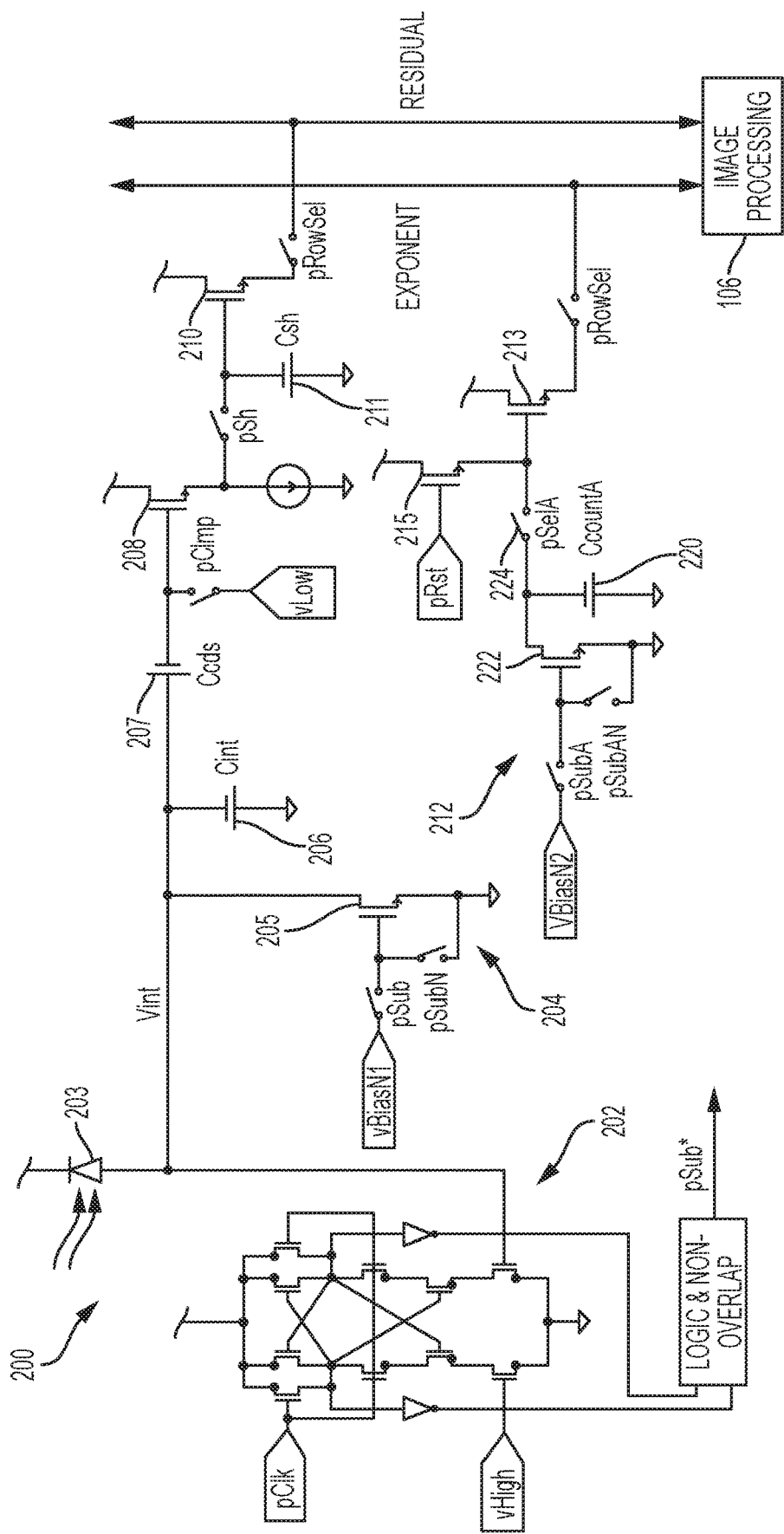
FIG. 2 is a block diagram illustrating a digital unit cell according to aspects described herein.

FIG. 2 is a block diagram illustrating a digital unit cell 200 according to aspects described herein. The digital unit cell 200 is included in at least one of the unit cells 160 and includes a dynamic comparator 202, a photodiode 203, a charge subtraction circuit 204, an integration capacitor 206, a CDS capacitor 207, a buffer 208, a residual readout circuit 210, an analog counter 212, and a sample and hold capacitor 211. The analog counter 212 includes a first switch (pSubA), a second switch (pSubAN), a count capacitor 220, a transistor 222, a counter readout circuit 213, and a reset circuit 215. The charge subtraction circuit includes a first switch (pSub), a second switch (pSubN), and a transistor 205.

The dynamic comparator 202, photodiode 203, and the charge subtraction circuit 204 are coupled to the integration capacitor 206. The CDS capacitor 207 is coupled between the integration capacitor 206 and the buffer 208. The residual readout circuit 210 is coupled to the buffer 208 and is also configured to be coupled to the image processing unit 106. The sample and hold capacitor 211 is coupled to the residual readout circuit 210. The first switch (pSub) of the charge subtraction circuit 204 is coupled between a bias voltage (vBiasN1) and a gate of the transistor 205. The second switch (pSubN) of the charge subtraction circuit 204 is coupled between the gate of the transistor and ground.

The analog counter 212 and the charge subtraction circuit 204 are in communication with the dynamic comparator 202. The first switch (pSubA) of the analog counter 212 is selectively coupled between a bias voltage (VBiasN2) and a gate of the transistor 222. The second switch (pSubAN) is selectively coupled between the gate of the transistor 222 and ground. The source of the transistor 222 is coupled to ground and the drain of the transistor 222 is coupled to the count capacitor 220. The count capacitor 220 is also coupled to the reset circuit 215 and the counter readout circuit 213. The counter read circuit 213 is configured to be coupled to the image processing unit 106.

Figure 3:
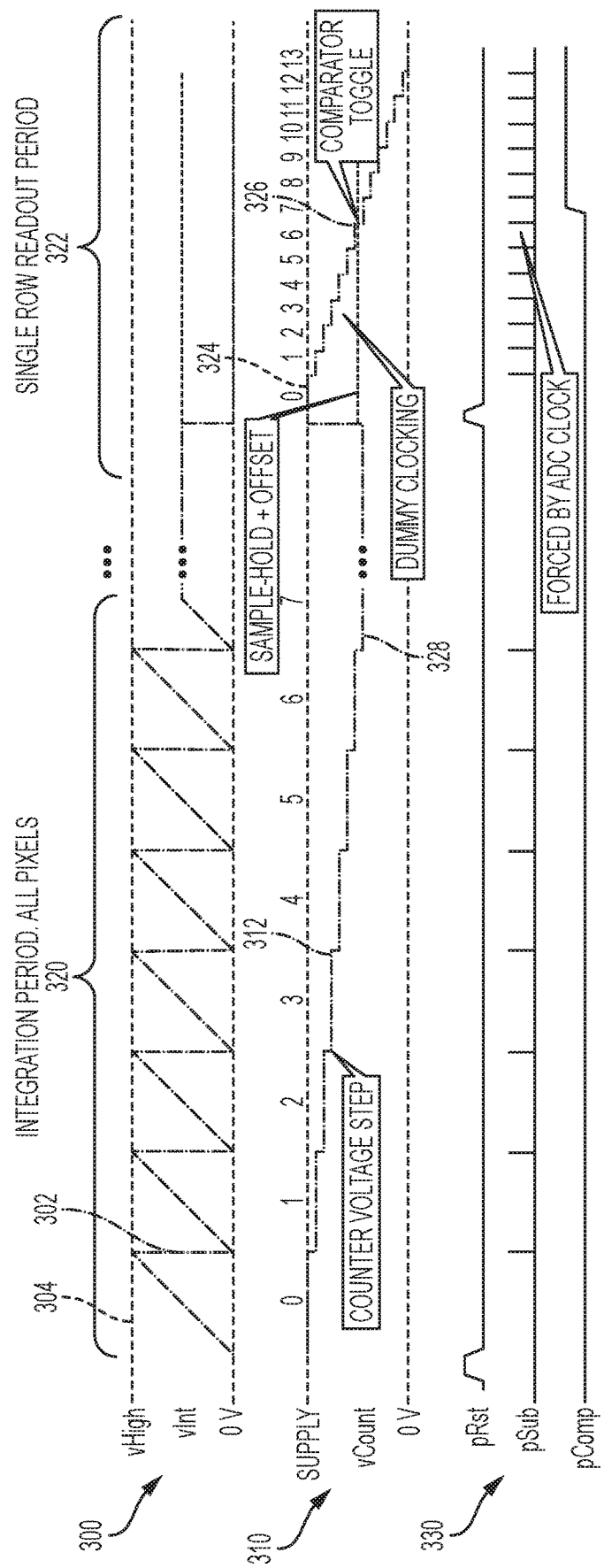
FIG. 3 includes graphs illustrating different voltages in the digital unit cell during operation of the digital unit cell according to at least one embodiment.

Operation of the digital unit cell 200 is described below with respect to FIG. 3. FIG. 3 includes graphs illustrating different voltages in the digital unit cell 200 during operation of the digital unit cell according to at least one embodiment. FIG. 3 includes a first graph 300 including a first trace 302 representing the voltage across the integration capacitor over time and a second trace 304 representing a threshold voltage (vHigh). FIG. 3 also includes a second graph 310 including a trace 312 representing count voltage across the count capacitor 220 over time.

At the start of an integration period (i.e., time=0), the voltage 302 across the integration capacitor 206 is zero volts and the reset circuit 215 sets the count voltage 312 across the count capacitor 220 to a desired initial count voltage. For example, at the start of an integration period, a reset signal (pRst) is provided (e.g., by the image processing unit 106 or another controller) to the reset circuit 215. Upon receiving the reset signal (pRst), the reset circuit 215 couples the count capacitor 220 to a desired initial count voltage. In one embodiment, the initial count voltage is 3.4V; however, in other embodiments, the initial count voltage is configured differently. The initial count voltage of 3.4V across the count capacitor 220 is understood (e.g. by the image processing unit 106) to represent a count value of zero.

As optical radiation (e.g., an input light signal) from a scene is incident on the photodiode 203, a resulting photocurrent from the photodiode 203 is provided to the integration capacitor 206 and charge corresponding to the flux of the optical radiation incident on the photodiode 203 accumulates on the integration capacitor 206. As charge accumulates on the integration capacitor 206, the voltage 302 across the integration capacitor 206 increases at a rate equal to the level of the photocurrent divided by the capacitance (Cint) of the integration capacitor 206 (i.e., the slope of the trace 302 depends on the intensity of the flux of the optical radiation incident on the photodiode 203). The voltage 302 across the integration capacitor is monitored by the dynamic comparator 202. More specifically, the voltage 302 across the integration capacitor 206 is compared, by the dynamic comparator 202, to the threshold voltage (vHigh) 304.

In response to a determination that the voltage 302 across the integration capacitor 206 is less than the threshold voltage (vHigh) 304, the dynamic comparator outputs a low pSub* control signal. The low pSub* control signal is provided to the first switch (pSub) and the second switch (pSubN) of the charge subtraction circuit 204 and to the first switch (pSubA) and the second switch (pSubAN) of the analog counter 212. The low pSub* control signal operates the first switch (pSub) of the charge subtraction circuit 204 to remain open and the second switch (pSubN) of the charge subtraction circuit 204 to remain closed. As such, the gate of the transistor 205 is coupled to ground and the charge subtraction circuit 204 does not impact the voltage across the integration capacitor 206 (i.e., the voltage 302 continues to increase as optical radiation is incident on the photodiode 203). The low pSub* control signal operates the first switch (pSubA) of the analog counter 212 to remain open and the second switch (pSubAN) of the analog counter 212 to remain closed. As such, the gate of the transistor 222 is coupled to ground and the count voltage 312 across the count capacitor 220 is unchanged.

In response to a determination that the voltage 302 across the integration capacitor 206 is greater than the threshold voltage (vHigh) 304, the dynamic comparator 202 outputs a high pSub* control signal. The high pSub* control signal is provided to the first switch (pSub) and the second switch (pSubN) of the charge subtraction circuit 204 and to the first switch (pSubA) and the second switch (pSubAN) of the analog counter 212. The high pSub* control signal operates the first switch (pSub) of the charge subtraction circuit 204 to close and the second switch (pSubN) of the charge subtraction circuit 204 to open, thereby providing the bias signal vBiasN1 to the gate of the transistor 205. The bias signal vBiasN1 at the gate of the transistor 205 operates the transistor 205 to couple the integration capacitor 206 to ground and the integration capacitor 206 is discharged to ground (i.e., the voltage 302 across the integration capacitor 206 goes to zero). In one embodiment, the bias signal vBiasN1 is provided to the gate of the transistor 205 by the image processing unit 106; however, in other embodiments, the bias signal vBiasN1 is provided to the gate of the transistor 205 by another controller in communication with the digital unit cell 200.

The high pSub* control signal also operates the first switch (pSubA) of the analog counter 212 to close and the second switch (pSubAN) of the analog counter 212 to open, thereby providing the bias signal vBiasN2 to the gate of the transistor 222. In one embodiment, the bias signal vBiasN2 is provided to the gate of the transistor 222 by the image processing unit 106; however, in other embodiments, the bias signal vBiasN2 is provided to the gate of the transistor 222 by another controller in communication with the digital unit cell 200.

The bias signal vBiasN2 provided to the gate of the transistor 222 is configured such that is operates the transistor 222 to remove a fixed amount of charge from the count capacitor 220. According to at least one embodiment, the fixed amount of charge removed from the count capacitor 220 is defined by the pulse width and the current magnitude of the bias signal vBiasN2. As the fixed amount of charge is removed from the count capacitor 220, the count voltage 312 across the count capacitor 220 is also reduced by a fixed amount (a 'step voltage'). According to one embodiment, the count voltage 312 across the count capacitor is reduced by a step voltage of around 0.075V; however, in other embodiments, the amount by which voltage 312 across the count capacitor is reduced (i.e., and the corresponding fixed amount of removed charge) may be set to some other appropriate value.

Once the voltage 302 across the integration capacitor 206 drops to zero, the dynamic comparator 202 again outputs a low pSub* control signal that operates the first switch (pSub) of the charge subtraction circuit 204 to open, the second switch (pSubN) of the charge subtraction circuit 204 to close, the first switch (pSubA) of the analog counter 212 to open and the second switch (pSubAN) of the analog counter 212 to close. Once the second switch (pSubN) of the charge subtraction circuit 204 is closed, the integration capacitor 206 again accumulates charge from the photocurrent generated by the photodiode 203 in response to radiation incident on the photodiode 203 (i.e., the voltage 302 across the integration capacitor 206 increases).

In response to a determination that the voltage 302 across the integration capacitor 206 is again greater than the threshold voltage (vHigh) 304, the dynamic comparator 202 outputs the high pSub* control signal. The high pSub* control signal operates the first switch (pSub) of the charge subtraction circuit 204 to close and the second switch (pSubN) of the charge subtraction circuit 204 to open, thereby providing the bias signal vBiasN1 to the gate of the transistor 205. The bias signal vBiasN1 at the gate of the transistor 205 operates the transistor 205 to couple the integration capacitor 206 to ground and the integration capacitor 206 is discharged to ground (i.e., the voltage 302 across the integration capacitor 206 again goes to zero).

The high pSub* control signal also operates the first switch (pSubA) of the analog counter 212 to close and the second switch (pSubAN) of the analog counter 212 to open, thereby providing the bias signal vBiasN2 to the gate of the transistor 222. The bias signal vBiasN2 provided to the gate of the transistor 222 is configured such that is operates the transistor 222 to again remove the fixed amount of charge from the count capacitor 220 and reduce the count voltage 312 across the count capacitor 220 by the fixed amount. Once the voltage 302 across the integration capacitor 206 drops to zero, the dynamic comparator 202 again outputs a low pSub* control signal that operates the circuit 200 such that charge is again accumulated on the integration capacitor 206.

The process described above of accumulating charge on the integration capacitor 206, discharging the integration capacitor 206 when the voltage 302 across the integration capacitor 206 exceeds the threshold voltage (vHigh) 304, and reducing the count voltage 312 across the count capacitor 220 each time the charge on the integration capacitor 206 is reset, continuously repeats until the end of the integration period. At the end of the integration period (e.g., at time=50 mS as shown in FIG. 3), the residual voltage across the integration capacitor is read using the methods discussed herein with respect to FIGS. 3 and 4.

Upon reading out the residual voltage and the analog counter voltage level in parallel, a readout circuit 400 analyzes the voltages to determine the total amount of charge accumulated during the entire integration period. For example, by knowing the initial value at which the count capacitor 220 is set (e.g., 3.4V), the voltage across the count capacitor 220 at the end of the integration period (e.g., 2.6V as shown in FIG. 3), and the voltage change of the count capacitor 220 at each reset event (e.g., 0.075V), the readout circuitry 400 can identify the number of times that the charge subtraction circuit 204 has reset the charge on the integration capacitor 206.

As described above, the count voltage of an analog counter is decreased each time the integration capacitor is reset. However, in other embodiments, the count voltage of an analog counter may be increased each time the integration capacitor is reset.

As also described above, the integration capacitor 206 is coupled to the buffer 208 via the CDS capacitor 207; however, in other embodiments, the CDS capacitor 207 may be removed and the integration capacitor 206 can be coupled directly to the buffer 208 or to the sample and hold capacitor 211 via a sample and hold switch (pSH).

Figure 4:
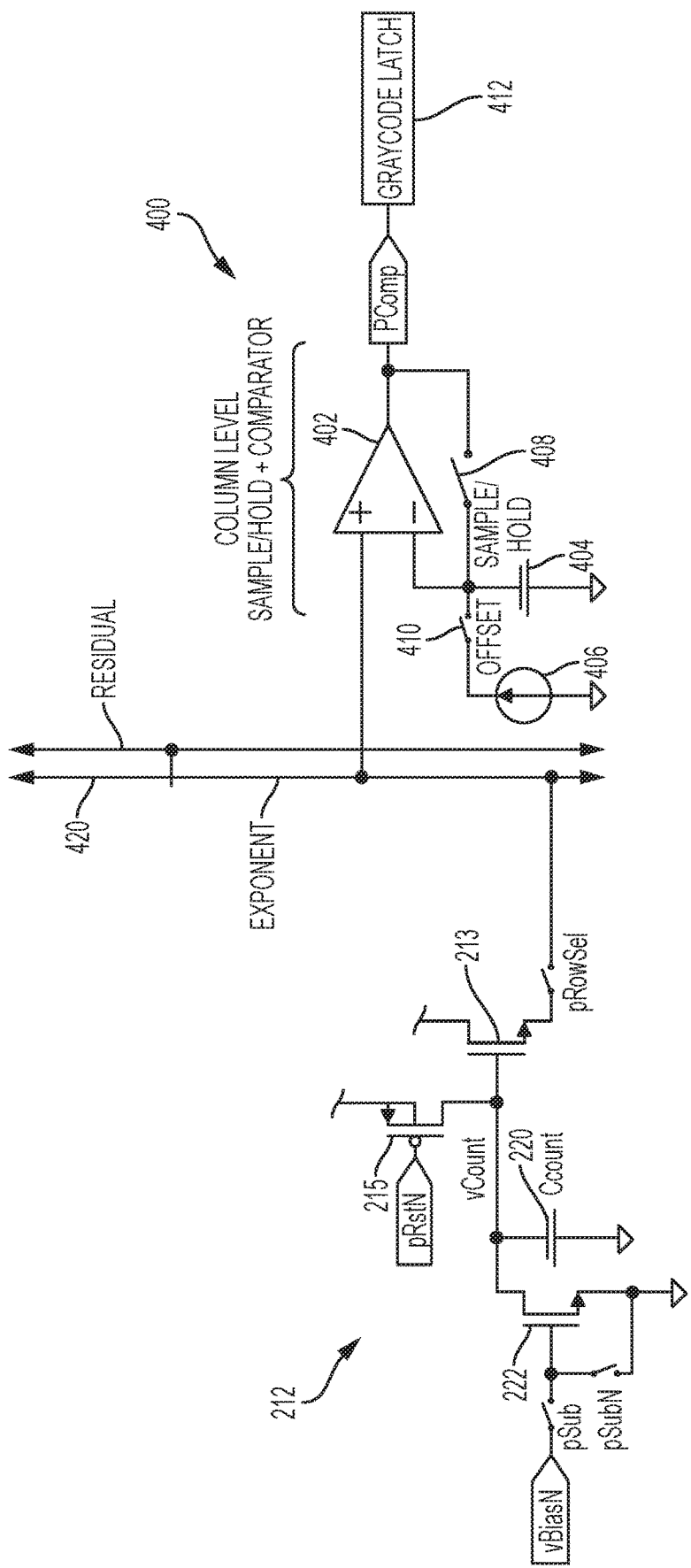
FIG. 4 shows a readout circuit for reading out a voltage of the analog counter of FIG. 2.

FIG. 4 shows a readout circuit 400 for reading out a voltage of the analog counter 212 of FIG. 2. The analog counter 212 of FIG. 2 is shown again in FIG. 4 for ease of illustration. Output of the analog counter 212 at the end of the integration period (i.e., vCount 328, FIG. 3) is provided to an exponent line 420 which also serves as an input to the readout circuit 400. The readout circuit 400 includes a sample hold and comparator circuit that receives the voltage from the analog counter 212. The sample hold and comparator circuit includes an operation amplifier 402 a storage capacitor 404 and a voltage offset circuit, such as current source 406. Sample/hold switch 408 and offset switch 410 are used to control storage of a voltage at the storage capacitor 404.

At the end of the integration period, the voltage (i.e., vCount 328, FIG. 3) at the analog counter 212 is sent to the sample hold and comparator circuit of the read out circuitry 320 and is stored at the storage capacitor 404 by closing sample/hold switch 408 and opening offset switch 410. Following storage of the voltage at the storage capacitor 406, sample/hold switch 408 is opened and offset switch 410 is closed. In this switch configuration, the voltage of the storage capacitor 404 is provided as an input (e.g., the V_input) to the operation amplifier 402. The other input (e.g., the $V_+$ input) to the operation amplifier is provided from the analog counter 212.

Referring to both FIG. 3 and FIG. 4, the integration period 320 is following by a readout period 322 in which the voltage at the storage capacitor 404 is determined using the operational amplifier 402 and a voltage provided to the operational amplifier 402 from the analog counter 212. In particular, during the readout period 322, the voltage provided by the analog counter 212 (herein referred to as "dummy voltage 324" is used to determine the voltage of the storage capacitor 404. At the beginning of the readout period 322, the dummy voltage 324 is set to the threshold voltage (vSupply) and stepped down by the selected step voltage (e.g., 0.075 V), which is the same step voltage used to decrease the voltage 312 during the integration period 320. When the dummy voltage 324 drops below the voltage at the V_input of the operational amplifier 402, the output of the operational amplifier 402 output toggles from one state to another to provide a signal ("pComp") to a grayscale latch 412 in order to determine a grayscale indicative of the voltage on the storage capacitor 404. The "pComp" value can thus be used for image processing. In various embodiments, the dummy voltage 324 is decreased relatively quickly during the readout period 322 in comparison to the speed at which the voltage 312 is decreased during the integration period 320. Thus, the voltage at the storage capacitor 404 can be read out relatively quickly.

In various embodiments, the voltage at the storage capacitor 404 (i.e., vCount) can be determined by counting the number a timing signal ("pSub"). A clock circuit 330 keeps a count of the number of steps of the dummy voltage 324. When the operation amplifier 402 has been toggled, the "pSub" count is multiplied by the size of the step voltage (e.g., 0.075V) and the resulting product is subtracted from vSupply to find the value of vCount 328.

In various embodiments, an offset voltage (δV) is induced by the current source 406 and is combined with the voltage of the storage capacitor 404 at the V_input to the operational amplifier 402. The offset voltage δV is less than the step voltage (e.g., δV<0.075V). The offset voltage raises the value at the V_input of the operational amplifier 402 to slightly higher than the voltage at the storage capacitor 404. This slight increase in voltage at the V_input allows the stepped edge in the dummy voltage to provide a clear time 326 at which the dummy voltage 324 drops below vCount 328, thereby providing for an accurate count of "pSub" and an accurate calculation of voltage (vCount 328) at the storage capacitor 404.

Therefore in one aspect, a method of operating an analog counter of a digital unit cell is disclosed. The method includes storing a voltage from the analog counter to a storage capacitor of a read out circuit at an end of an integration period, generating a dummy voltage at the analog counter, comparing the voltage at the storage capacitor to the dummy voltage level to read out the voltage stored at the readout circuit, and determining the voltage at the storage capacitor when the dummy voltage falls below the voltage at the storage capacitor.

The method further includes comparing the dummy voltage to a summation of the voltage at the storage capacitor and an offset voltage. Comparing the voltage at the storage capacitor to the dummy voltage further includes recording a time at which the dummy voltage becomes less than the voltage at the storage capacitor. Generating the dummy voltage further includes setting the dummy voltage a supply line voltage, and decreasing the dummy voltage by a step voltage at least once during the readout period. The method further includes counting a number of times the step voltage is applied to the dummy voltage to lower the dummy voltage to less than the voltage on the storage capacitor and determining the stored voltage level from the count of time steps and the magnitude of the step voltage. The step voltage for the dummy voltage is the same as a step voltage increment during an integration period of the analog counter during an integration period. In one embodiment, the method further includes outputting a gray scale level indicative of the voltage at the storage capacitor.

In another aspect, a readout circuit for a digital unit cell includes a storage capacitor for storing a voltage remaining at an analog counter at the end of an integration period, and a comparator circuit. The comparator circuit is configured to compare a dummy voltage provided from the analog counter during a readout period to the voltage at the storage capacitor, and determine the voltage at the storage capacitor when the dummy voltage falls below the voltage at the storage capacitor.

The readout circuit further includes a voltage offset circuit for generating an offset voltage, wherein the comparator circuit compares the dummy voltage to a summation of the voltage at the storage capacitor and the offset voltage. The readout circuit further includes a clock circuit that records a time at which the dummy voltage becomes less than the voltage at the storage capacitor. The dummy voltage is set to a supply line voltage at the beginning of a readout period, and decreases by a step voltage at least once during the readout period. The clock circuit counts a number of times the step voltage is applied to the dummy voltage to lower the dummy voltage to less than the voltage on the storage capacitor, wherein the stored voltage level is determined from the counted number of time steps and the magnitude of the step voltage. The step voltage for the dummy voltage is the same as a step voltage of the analog counter during the integration period. In one embodiment, the readout circuit outputs a gray scale level indicative of the stored voltage.

In yet another aspect, a digital unit cell includes an analog counter that outputs a voltage level at an end of an integration period and generates a dummy voltage during a readout period, and a readout circuit configured to: store the voltage level obtained at the analog counter at the end of the integration period, compare the voltage at the storage capacitor to the dummy voltage during the readout period, and determine the voltage at the storage capacitor when the dummy voltage falls below the voltage at the storage capacitor.

The readout circuit includes a storage capacitor that stores the voltage output by the analog counter and a comparator circuit for comparing the dummy voltage to the voltage at the storage capacitor. The digital unit cell further includes a clock circuit that records a time at which the dummy voltage becomes less than the storage circuit voltage. The analog counter sets the dummy voltage to a supply line voltage at the beginning of the readout period and decreases the dummy voltage by a step voltage at least once during the readout period. The digital unit cell further includes a clock circuit that counts a number of voltage steps required to lower the dummy voltage to less than the voltage at the storage capacitor, wherein the stored voltage is determined from the counted number of voltage steps and a magnitude of the voltage steps. The step voltage during the readout period is the same as a step voltage during the integration period.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for exemplary embodiments with various modifications as are suited to the particular use contemplated.

While the exemplary embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of operating an analog counter of a digital unit cell, comprising:
   storing a voltage from the analog counter to a storage capacitor of a read out circuit at an end of an integration period;
   generating a dummy voltage at the analog counter;
   comparing the voltage at the storage capacitor to the dummy voltage level to read out the voltage stored at the readout circuit; and
   determining the voltage at the storage capacitor when the dummy voltage falls below the voltage at the storage capacitor.

2. The method of claim 1, further comprising comparing the dummy voltage to a summation of the voltage at the storage capacitor and an offset voltage.

3. The method of claim 1, wherein comparing the voltage at the storage capacitor to the dummy voltage further comprises recording a time at which the dummy voltage becomes less than the voltage at the storage capacitor.

4. The method of claim 1, wherein generating the dummy voltage further comprises:
   setting the dummy voltage a supply line voltage; and
   decreasing the dummy voltage by a step voltage at least once during the readout period.

5. The method of claim 4, further comprising counting a number of times the step voltage is applied to the dummy voltage to lower the dummy voltage to less than the voltage on the storage capacitor and determining the stored voltage level from a count of a number of times the step voltage is applied and the magnitude of the step voltage.

6. The method of claim 4, wherein the step voltage for the dummy voltage is the same as a step voltage increment during an integration period of the analog counter during an integration period.

7. The method of claim 1, further comprising outputting a gray scale level indicative of the voltage at the storage capacitor.

8. A readout circuit for a digital unit cell, comprising:
   a storage capacitor for storing a voltage remaining at an analog counter at the end of an integration period; and
   a comparator circuit configured to:
      compare a dummy voltage provided from the analog counter during a readout period to the voltage at the storage capacitor, and
      determine the voltage at the storage capacitor when the dummy voltage falls below the voltage at the storage capacitor.

9. The readout circuit of claim 8, further comprising a voltage offset circuit for generating an offset voltage, wherein the comparator circuit compares the dummy voltage to a summation of the voltage at the storage capacitor and the offset voltage.

10. The readout circuit of claim 8, further comprising a clock circuit that records a time at which the dummy voltage becomes less than the voltage at the storage capacitor.

11. The readout circuit of claim 8, wherein the dummy voltage is set to a supply line voltage at the beginning of the readout period, and decreases by a step voltage at least once during the readout period.

12. The readout circuit of claim 11, further comprising a clock circuit, wherein the clock circuit counts a number of times the step voltage is applied to the dummy voltage to lower the dummy voltage to less than the voltage at the storage capacitor, wherein the stored voltage level is determined from a counted number of times the step voltage is applied and the magnitude of the step voltage.

13. The readout circuit of claim 11, wherein the step voltage for the dummy voltage is the same as a step voltage of the analog counter during the integration period.

14. The readout circuit of claim 8, wherein the readout circuit outputs a gray scale level indicative of the stored voltage.

15. A digital unit cell, comprising:
   an analog counter that outputs a voltage at an end of an integration period and generates a dummy voltage during a readout period; and
   a readout circuit configured to:
      store the voltage obtained at the analog counter at the end of the integration period at a storage capacitor,
      compare the voltage at the storage capacitor to the dummy voltage during the readout period, and
      determine the voltage at the storage capacitor when the dummy voltage falls below the voltage at the storage capacitor.

16. The digital unit cell of claim 15, wherein the readout circuit includes a comparator circuit for comparing the dummy voltage to the voltage at the storage capacitor.

17. The digital unit cell of claim 15, further comprising a clock circuit that records a time at which the dummy voltage becomes less than the voltage at the storage circuit.

18. The digital unit cell of claim 15, wherein the analog counter sets the dummy voltage to a supply line voltage at the beginning of the readout period and decreases the dummy voltage by a step voltage at least once during the readout period.

19. The digital unit cell of claim 18, further comprising a clock circuit that counts a number of voltage steps required to lower the dummy voltage to less than the voltage at the storage capacitor, wherein the stored voltage is determined from the counted number of voltage steps and a magnitude of the voltage steps.

20. The digital unit cell of claim 18, wherein the step voltage during the readout period is the same as a step voltage during the integration period.

* * * * *